United States Patent [19]
Chen et al.

[11] Patent Number: 5,500,831
[45] Date of Patent: *Mar. 19, 1996

[54] RAS ENCODED GENERATOR FOR A MEMORY BANK

[75] Inventors: Roger Chen; Kenneth K. Kinsey, Jr., both of San Jose, Calif.

[73] Assignee: Advanced Peripherals Labs, Inc., San Jose, Calif.

[ * ] Notice: The term of this patent shall not extend beyond the expiration date of Pat. No. 5,465,237.

[21] Appl. No.: 458,940

[22] Filed: Jun. 2, 1995

Related U.S. Application Data

[63] Continuation of Ser. No. 347,967, Dec. 1, 1994, Pat. No. 5,465,237.

[51] Int. Cl.⁶ ....................................................... G11C 8/00
[52] U.S. Cl. .......................... 365/233; 365/193; 365/222
[58] Field of Search .................................... 365/233, 222, 365/193, 230.06

[56] References Cited

U.S. PATENT DOCUMENTS

5,276,843  1/1994  Tillinghast .............................. 365/222

*Primary Examiner*—A. Zarabian
*Attorney, Agent, or Firm*—Benman Collins & Sawyer

[57] ABSTRACT

A circuit is provided that allows for the substitution of a memory module with one type of addressing scheme with a second memory module which has a different type of addressing scheme. Through the use of a row address strobe (RAS) generator and address generator which receives multiple RAS signals, a new RAS signal is generated that is in accordance with the one type of addressing scheme and an address signal is provided which indicates which portion of the memory is to be accessed.

8 Claims, 11 Drawing Sheets

RAS ENCODED GENERATOR FOR A MEMORY BANK

This is a continuation of application(s) Ser. No. 08/347,967 filed on Dec. 1, 1994, U.S. Pat. No. 5,465,237.

FIELD OF THE INVENTION

The present invention relates to a memory module in a computer system and more particularly to providing a plurality of different types of memory modules in a computer system.

BACKGROUND OF THE INVENTION

Computers using memory such as dynamic random access memory (DRAM) are well known in the art. Personal computers such as IBM AT and compatibles, use such DRAM memories for a variety of functions. Development in the personal computer (PC) industry has been the widespread acceptance of single inline memory modules (SIMMS). Such SIMMS are used to lower the cost of memory and many higher density memory subsystems can be designed using SIMMS. Since the SIMMS are relatively small modules, they are used extensively in the computer industry to allow for the proper operation. The DRAM chips themselves are very reliable. Therefore, errors due to DRAM are less common than when PCs were first introduced. At the same time cost of the personal computers has dropped dramatically and profit margins have been squeezed by intense competition. Typically in known computer systems a particular type of SIMM module is utilized therewithin. That SIMM module requires a particular addressing scheme for adequate operation. Hence, the addressing scheme is oftentimes limited to a particular type of DRAM, as there have become more and more different types of DRAMs. As more and different types of DRAMs come into existence with different types of addressing schemes, it becomes more difficult to design these different modules into a computer. This difficulty occurs because the memory controller used to control the SIMM module, or the memory within the computer, must generally be adaptable to driving one type of addressing scheme. To make a more complicated and complex-memory controller would require additional expense to the personal computer. Many of the larger memories, that is 2 Mb DRAMs, are not compatible with existing personal computers because their addressing schemes are very different than the existing addressing scheme.

For example, in a typical 1 Mb DRAM, for example Part No. MT4C4001J manufactured by Micron Technology, Inc., the Row Address Strobe (RAS) cycle requires 10 lines and on the Column Address Strobe (CAS) cycle requires 10 lines. Hence when two banks of these 1 Mb DRAMS are utilized, this addressing scheme required above works adequately for operation thereof. However, as many of the larger DRAMs such as 2 MB DRAMs, do not utilize this addressing scheme.

For example, a 2 Mb DRAM for example Part No. IBM0117800AT3 manufactured by International Business Machines Corporation has an addressing scheme which requires 11 bits for the RAS cycle and 10 bits for the CAS cycle. Therefore, to substitute the addressing scheme described above, 1 bank of the 2 Mb DRAM with 11/10 RAS/CAS for the 2 banks of 1 Mb DRAM with 10/10 RAS/CAS would allow half of the 2 Mb DRAM bank to be accessible due to the extra bit necessary for the RAS generation.

Accordingly, many SIMM module manufacturers continue to use the smaller 1 Mb DRAMs even though they are more expensive than the 2 Mb DRAMs and take up more space in the computer system. They are easily implemented in a typical personal computer. Accordingly, the costs and size considerations have largely been addressed by existing systems. What is desired therefore is a system for allowing for different types of memory modules with different addressing schemes to be substituted for existing memory modules, so as to allow for increased memory capacity with resultant lower cost associated with the larger memory units. The system that is developed should be cost effective, should not add undue complexity to the existing circuitry, and should also be compatible with existing circuitry. The present invention addresses such a need.

SUMMARY OF THE INVENTION

A circuit for providing an encoded row address strobe (RAS) in accordance with a first predetermined addressing scheme to a memory module which has a second predetermined addressing scheme within a computer is disclosed. The circuit comprises an RAS generator for receiving first and second RAS signals and generating a single RAS signal to the signals provided for the memory module. The circuit further includes an address generator for receiving the first and second RAS signal, for generating an address signal based upon the first and second RAS signals and for providing the address signal to indicate which portion of the memory module is to be accessed. The circuit in accordance with the present invention allows the memory module to operate in accordance with the first predetermined addressing scheme.

DETAILED DESCRIPTION OF THE DRAWINGS

The present invention relates to an improvement in the utilization of memory modules in computers. The following description is presented to enable one of ordinary skill in the art to make and use the invention as provided in the context of a particular application and its requirements. Various modifications to the preferred embodiments will be readily apparent to those skilled in the art, and the generic principles defined here may be applied to other embodiments. Thus, the present invention is not intended to be limited to the embodiments shown, but is to be accorded the widest scope consistent with the principles and novel features disclosed herein.

Figure 1:
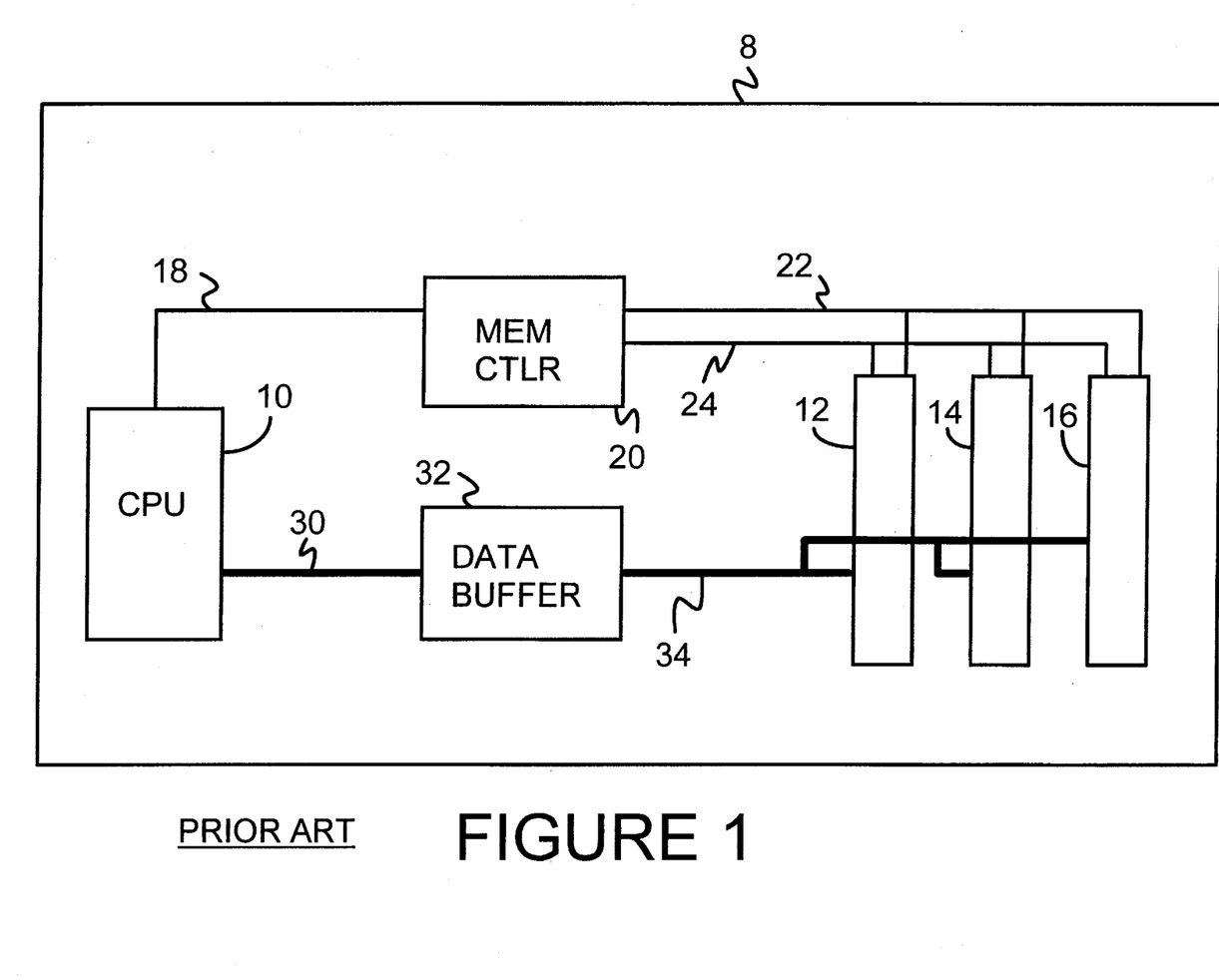
FIG. 1 is a block diagram of a simplified computer system.

FIG. 1 is a block diagram of a simplified PC system showing components located on system mother board 8. CPU 10 reads instructions from and transfers data to DRAM memory in SIMMs, located in one or more of banks 12, 14, 16. A system having only one SIMM bank populated with DRAM may be shipped to the user, who may later add additional DRAM by installing additional SIMMs. For example, a system may ship with a DRAM SIMM installed in bank 12, but with banks 14 and 16 empty. The user may later plug in a second SIMM bank 14 to increase memory use.

The CPU outputs an address on local address bus 18 to memory controller 20. Memory controller 20 decodes the address and activates control lines 22 to enable reading or writing to the DRAMs located in SIMM banks 12, 14, or 16. Control lines 22 typically include row address strobe (RAS), column address strobe (CAS), and write-enable (WE). Memory address lines 24 contain a multiplexed address for the DRAM inputs.

Data is transferred from CPU 10 to DRAM in SIMM banks 12, 14, 16 along local data bus 30, through data buffer 32, and out onto memory data bus 34, which is connected to SIMM banks 12, 14, 16.

Figure 2:
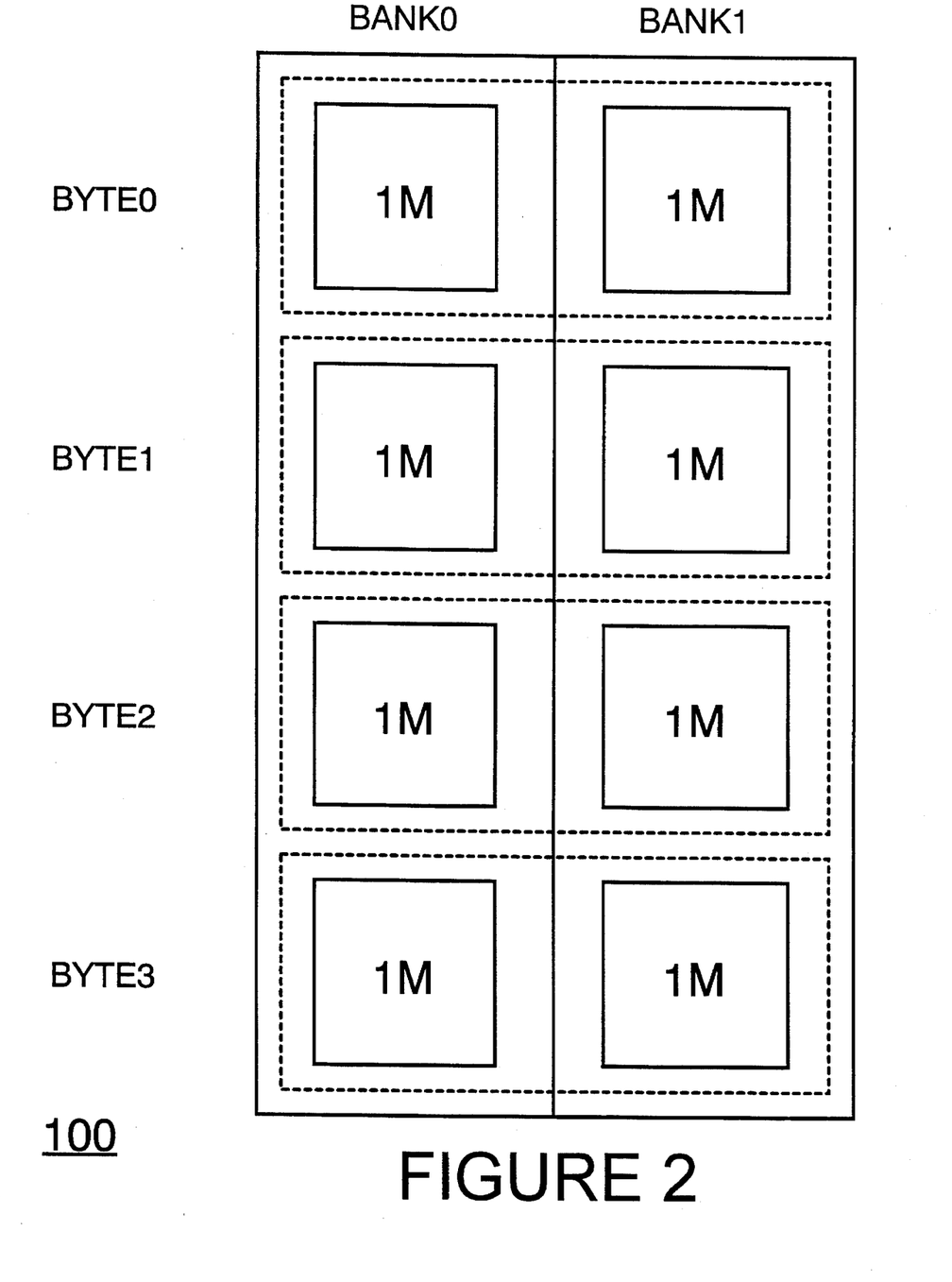
FIG. 2 is a block diagram of the physical implementation of two banks 100 of 1 megabyte (Mb) dynamic random access memories (DRAMs).
Figure 3:
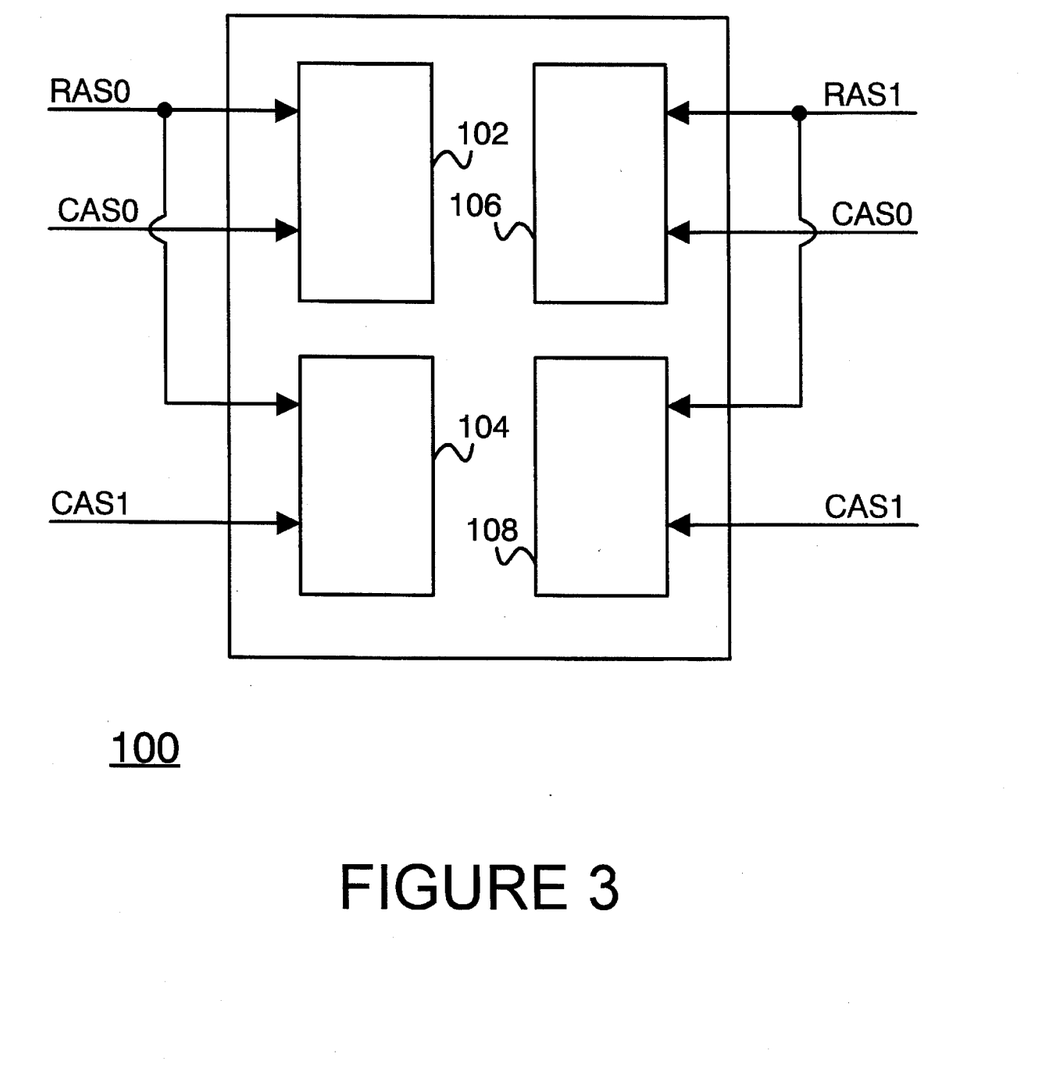
FIG. 3 is a diagram of the electrical connection of the two banks of DRAMS of FIG. 2.

FIG. 2 is a block diagram of a physical implementation of two banks 100 of 1 megabyte (Mb) dynamic random access memories (DRAMs). FIG. 3 is a diagram of the electrical connection of the four blocks 102, 104 106 and 108 of 1 megabyte DRAMs of FIG. 2. A typical bank of 1 Mb DRAM of this type are manufactured by Micron Technology, Inc. The addressing scheme of this type DRAM is a RAS/CAS that is 10 lines at the falling edge of the RAS of 10 lines, and then 10 lines at the falling edge of the CAS. As is seen the blocks 102 and 104 of 1 Mb DRAMs receive RAS0, CAS0 and CAS1 signals and blocks 106 and 108 receive RAS1, CAS0 and CAS1 signals.

Figure 4:
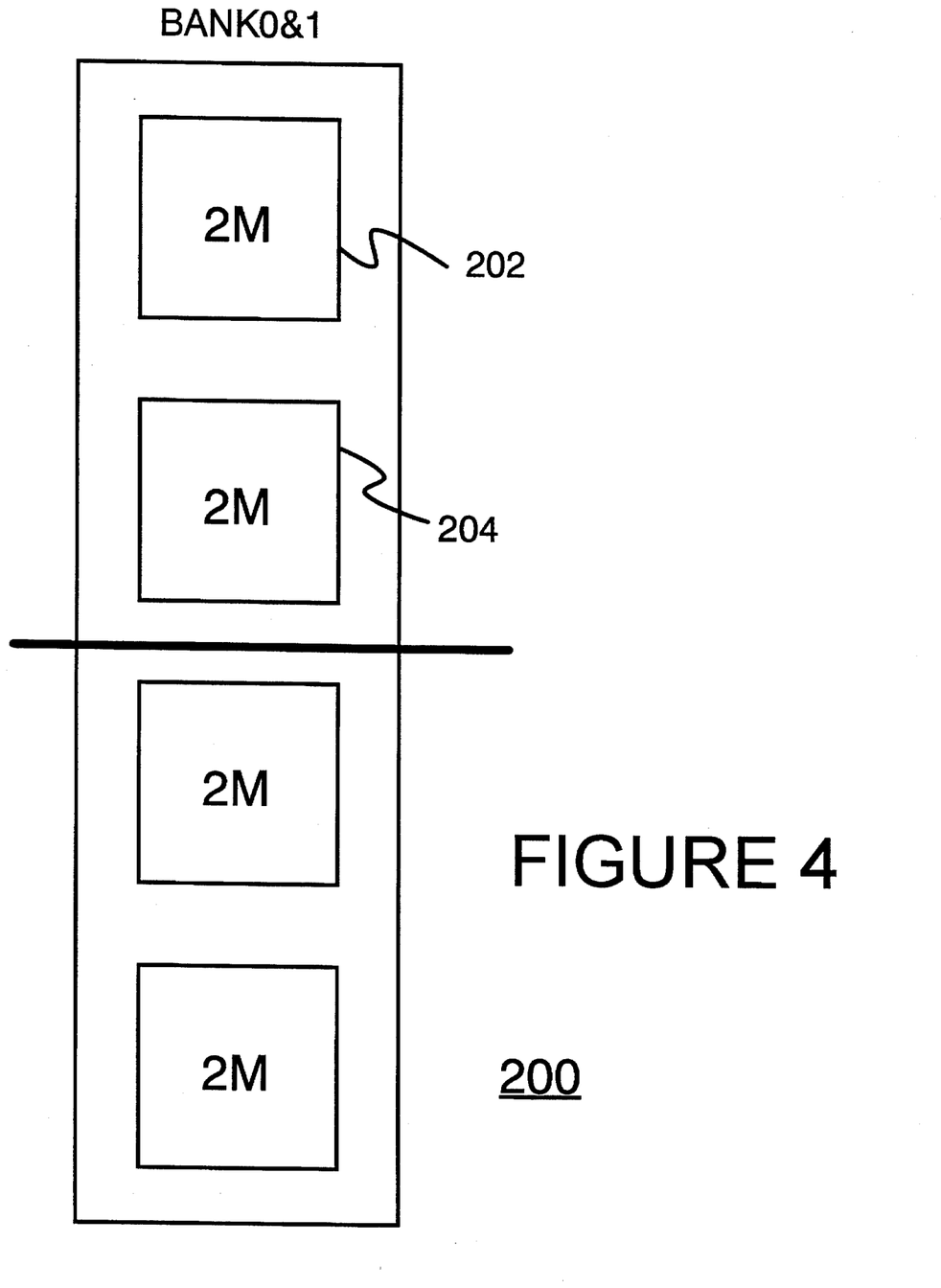
FIG. 4 is a block diagram of the physical implementation of 2 Mb DRAMs.

To reduce and to provide the same functionality of the computer as well as the same amount of memory in the computer, the number of components, and to reduce the cost, it would be preferable or desirable to have one bank 200 of 2 Mb DRAMs as shown in FIG. 4. FIG. 4 is a physical representation of the bank 200 of 2 Mb DRAMs.

One of the issues with using many types of the larger capacity DRAMs (i.e., 2 Mb) is that the number of lines that need to be addressed is different. For example, in one type of 2 Mb DRAM, eleven (11) lines are addressed at the RAS falling edge, and ten (10) lines are addressed at the CAS falling edge. Accordingly, if the two banks 200 of 1Mb DRAM of FIGS. 2 and 3 are simply replaced with the one bank of 2 Mb DRAM of FIG. 4, only half of the DRAMs will be accessed.

It should be understood that although this interchangeability issue has been discussed with respect to 1 Mb and 2 Mb DRAMs, one of ordinary skill in the art will readily recognize that as DRAMs becomes larger (i.e. 4 Mb and 16 Mb) this problem becomes more acute. Hence, as the cost of these larger DRAMs decreases as compared to the cost of the 1 Mb DRAM the desirability to substitute these larger DRAMs becomes greater. In addition, since these larger capacity DRAMs can be placed in memory modules which are the same size as the existing DRAMs a significant space savings within the computer system can be realized.

Accordingly, there are many different types of DRAM configurations that have different types of addressing schemes. However, a computer system typically recognizes that there is a SIMM module within the computer. The system does not typically recognize the addressing scheme of that particular DRAM. Accordingly, it is important to be able to provide a system and method that will allow for a number of different types of DRAMs to be interchanged within a motherboard of a computer system.

Figure 5:
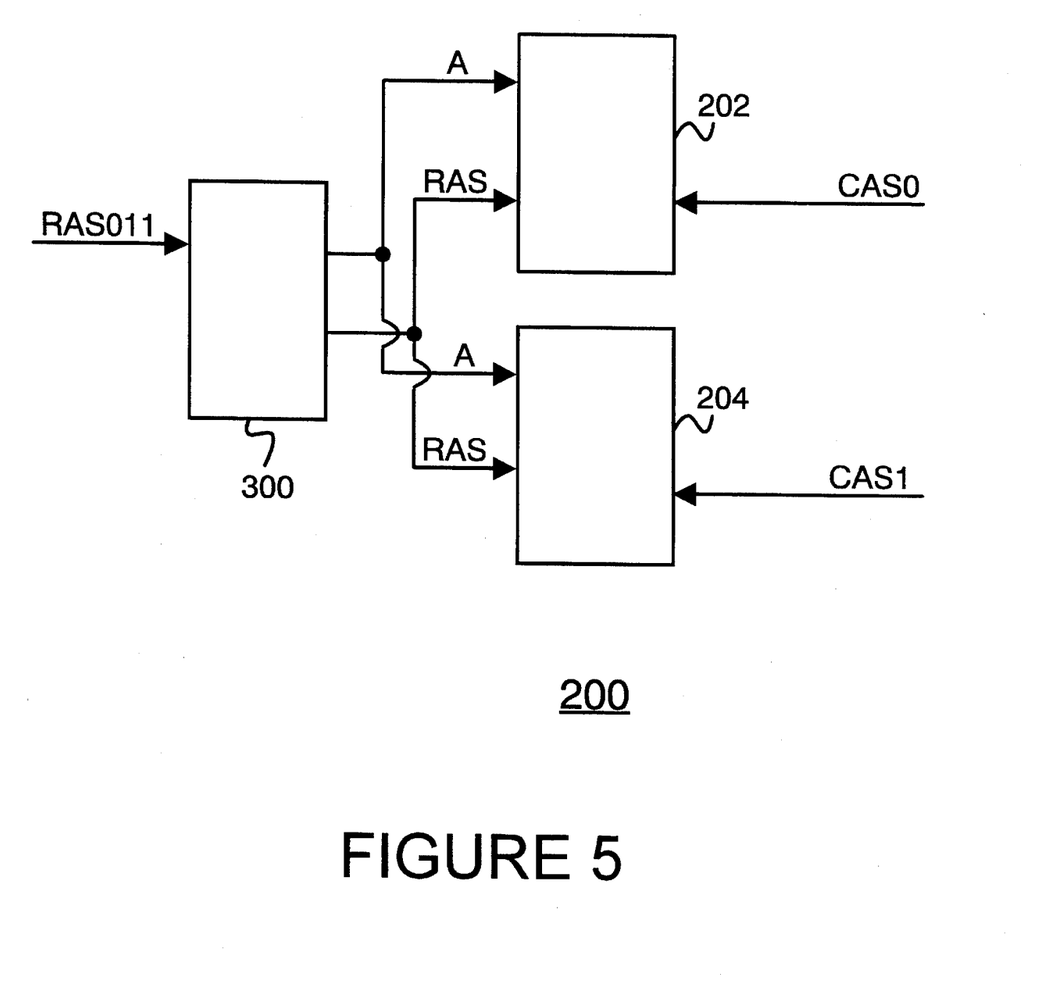
FIG. 5 is a diagram of the electrical connection of the 2 Mb DRAMs of FIG. 4 in conjunction with a block diagram of an encoded RAS generator circuit in accordance with the present invention.

FIG. 5 shows the electrical connection of the two blocks 202 and 204 of FIG. 4 including a RAS encoder circuit 300 for allowing the blocks 202 and 204 to be utilized interchangeably with the blocks 102–108 of the 1 Mb DRAM of FIG. 1.

In this embodiment, block 202 receives the CAS0 signal and block 204 receives the CAS1 signal. The circuit 300 provides an address signal (A) to memory and a new RAS signal (RAS) to two blocks 202 and 204, respectively. The state of the address (A) signal is utilized to provide an indication of which portion of the memory is to be accessed. For example, a one (1) A signal may indicate the right hand side of the memories 202 and 204 are to be accessed and a zero (0) address signal would indicate the left hand side of the memories 202 and 204 are to be addressed. Similarly, the state of A signal could indicate that the bottom, top or any other portion of the memories are to be accessed. The RAS signal then provides the appropriate addressing scheme to the memory block to allow for access thereto.

Accordingly, a typical addressing scheme for the 1 Mb DRAM memory of FIGS. 1 and 2 is 10 lines of RAS and then 10 lines of CAS. As has been above-mentioned, in some 2 Mb DRAMs, the addressing scheme utilizes 11 lines of RAS and then 10 lines of CAS. Through circuit 300, one of the lines of the incoming RAS signal is utilized to indicate which portion of the blocks 202 and 204 (via the A signal) are to be accessed. The RAS signal output then accesses the memory in the appropriate manner (10 lines) from RAS encoder circuit 300.

Figure 6:
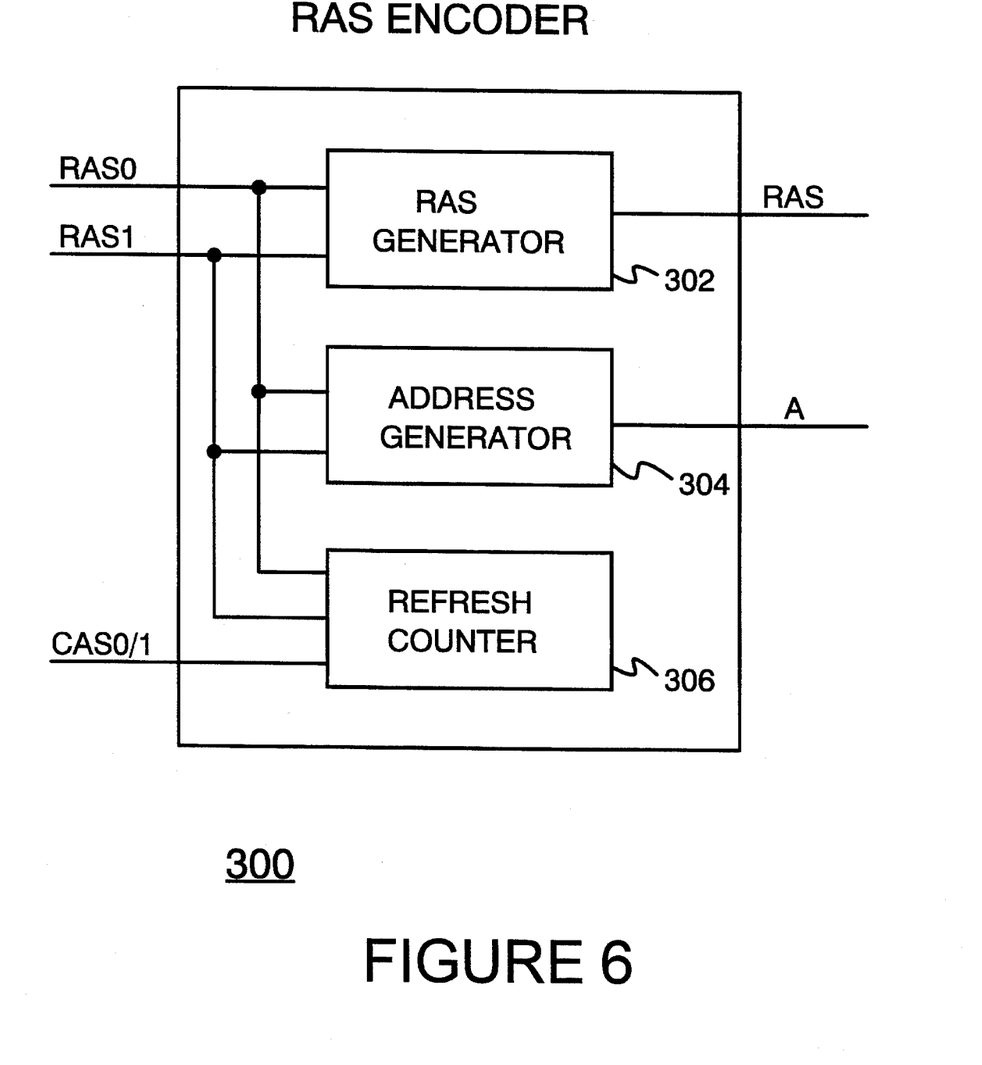
FIG. 6 is a detailed block diagram of a RAS encoder circuit in accordance with the present invention.

To more fully understand the operation of RAS encoder circuit 300, refer now to FIG. 6 which is a block diagram thereof. The RAS encoder circuit 300 includes a RAS generator circuit 302 which receives the RAS0 and RAS1 signals and provides a RAS output signal to the memory module. The RAS0 and RAS1 signals are also provided to an address generator 304 and refresh counter 306 respectively. The refresh counter also receives the CAS0/1 signal. The address generator 304 is coupled to receive signals from the refresh counter and provides the A signal for indicating the portion of memory to be accessed.

Figure 7:
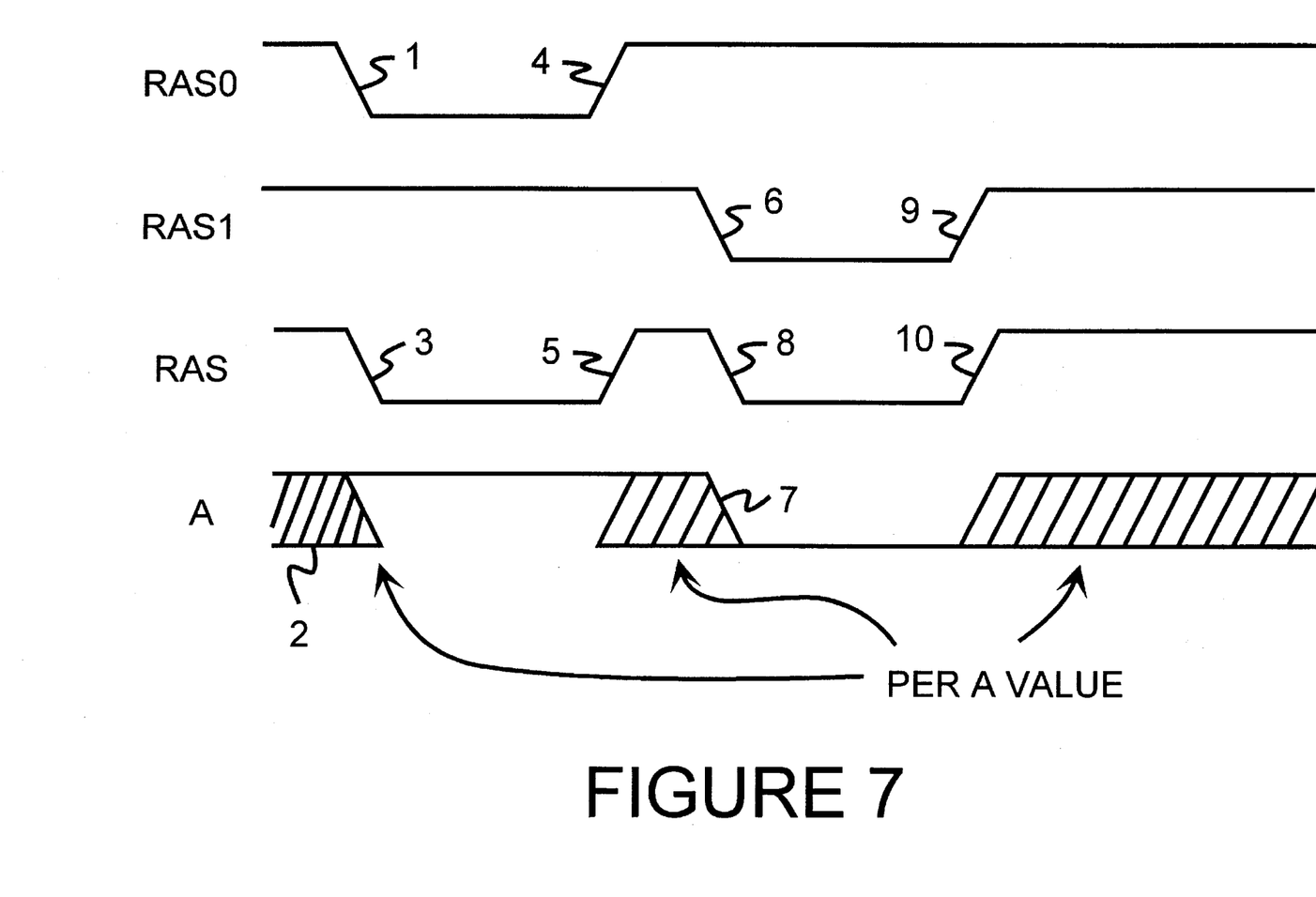
FIG. 7 is a timing diagram of the operation of the circuit of FIG. 6.

FIG. 7 is a timing diagram of operation of the blocks 202 and 204 of the system of FIG. 5 when utilizing RAS encoder circuit 300. In this embodiment, referring to both FIGS. 6 and 7 together, when the RAS0 becomes active, that is, the RAS0 falling edge occurs (1), the A signal goes active (2) just prior to the RAS going active low (3). This is to ensure that the address is latched into the memory. The RAS zero then becomes inactive high (4) a short time before the RAS A goes inactive high (5). Similarly, when the RAS1 goes low (6), the address will then go low (7) and thereafter the RAS A will go low (8). When RAS0 and RAS1 are both high at the same time, the address will keep the REF_A state.

Figure 8:
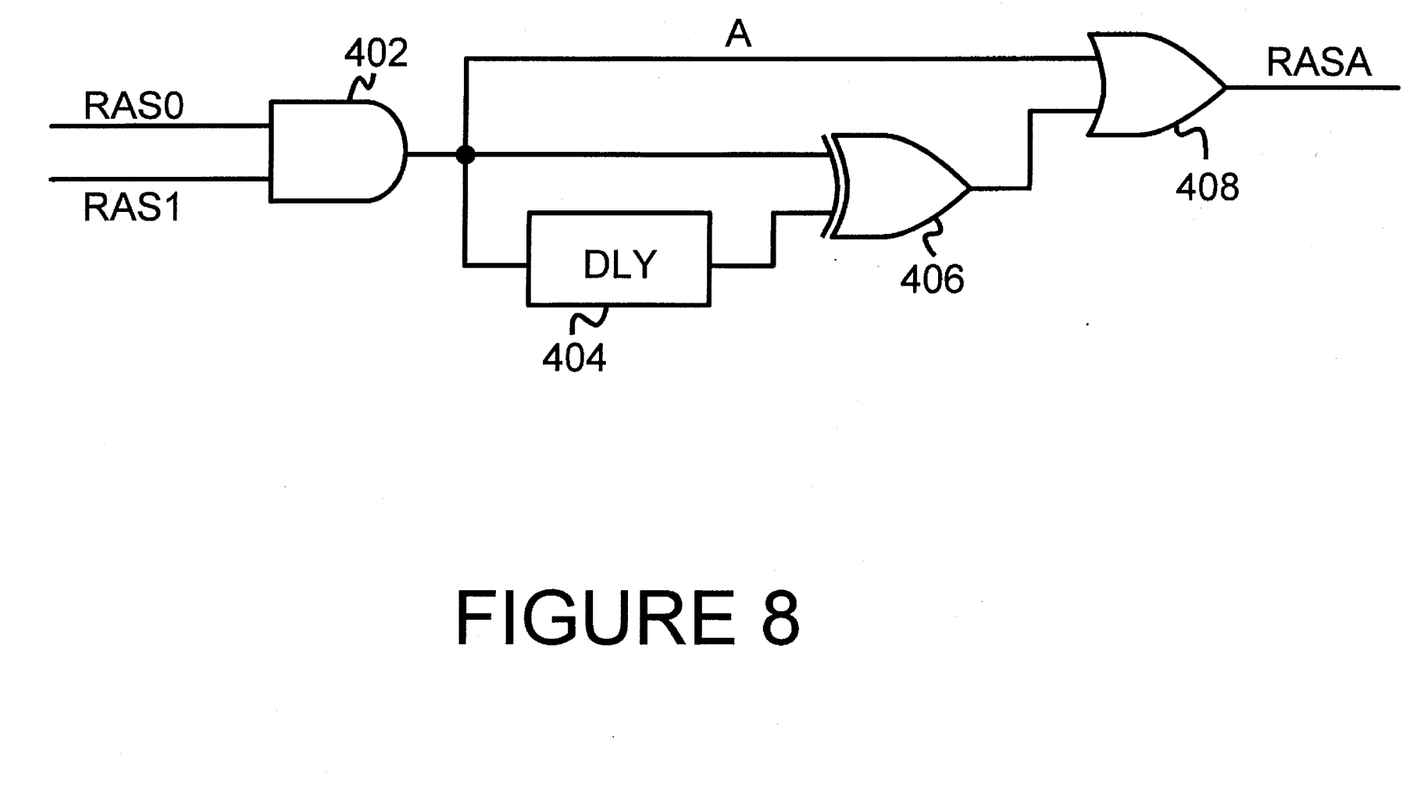
FIG. 8 is a diagram of a RAS generator utilized in the RAS encoder circuit of FIG. 7.

FIG. 8 is a diagram of a RAS generator circuit 302 which includes a delay element 404. The RAS generator circuit 302 includes a AND gate 402 which receives both the RAS0 and RAS1 signals which is coupled via the delay 404 to one input of a exclusive OR gate 406. The output of AND gate 402 is coupled to a second input of an exclusive OR gate 406. The output of exclusive OR gate 406 is coupled to one of the inputs of OR gate 408. The output of AND gate 402 is coupled to the other input of OR gate 408. The A signal is provided without the delay from the AND gate 402. The output of the exclusive OR gate 406 provides delay to the input of the OR gate 408. The OR gate output 408 generates the RAS signal.

Accordingly, the delay 404 ensures that the RAS signal is delayed a predetermined amount relative to the A signal to ensure that the address is latched into the memory. The delay between the A signal and the RAS signal can be any length dependent upon the application (typically under 40 nanoseconds.)

Figure 9:
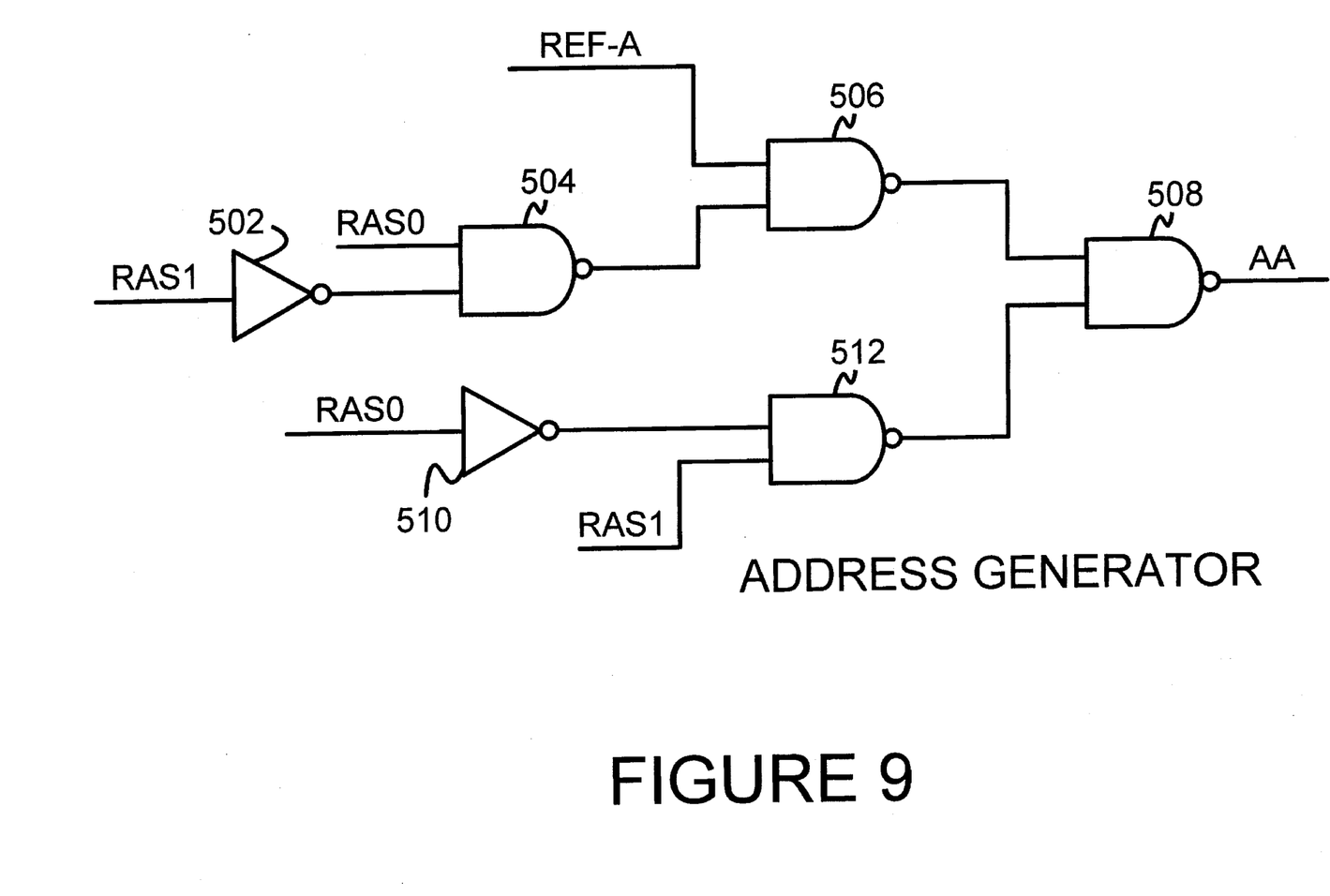
FIG. 9 is a diagram of an address generator utilized in the RAS encoder circuit of FIG. 7.

To more clearly understand the operation of the address generator 304 refer now to FIG. 9 which is a block diagram of a preferred embodiment. The address generator 304 comprises a first inverter 502 which receives the RAS1 signal and is coupled to a second input of NAND gate 504. The other input of NAND gate 504 is coupled to the RAS0 signal. The output of NAND gate 504 is coupled to one input of NAND gate 506. The second input of NAND gate 506 is coupled to a REFRESH ADDRESS (REF_A) signal from the refresh counter 306. The output from NAND gate 506 is coupled to one input of NAND gate 508.

Inverter 510 receives the RAS0 signal at its input. The output of inverter 510 is coupled to one input of the NAND gate 512. The RAS1 signal is coupled to the other input of NAND gate 512. The output of NAND gate 512 is coupled to a second input of NAND gate 508. The output of NAND gate 508 provides the A signal.

The address generator 304 of FIG. 9 operates in the following manner. If the RAS0 and RAS1 signals are either high or low together, the REF_A signal will determine the state of A signal. In either of these situations, the output from NAND gate 512 is always high due to inverter 510 and the input to NAND gate 506 from NAND gate 504 is always high due to inverter 502 (indicating the portion of the DRAM to be accessed).

When RAS0 is low and RAS1 is high, then the A output is always going to be high because the output from NAND gate 512 will always be low due to operation of inverter 510 (indicating the portion of the DRAM to be accessed).

When RAS0 is high and RAS1 is low, then the A output is always low due to operation of inverter 502. Accordingly, through the above discussion it is seen that address generator 304 provides for the appropriate address signal to the DRAM.

Figure 10:
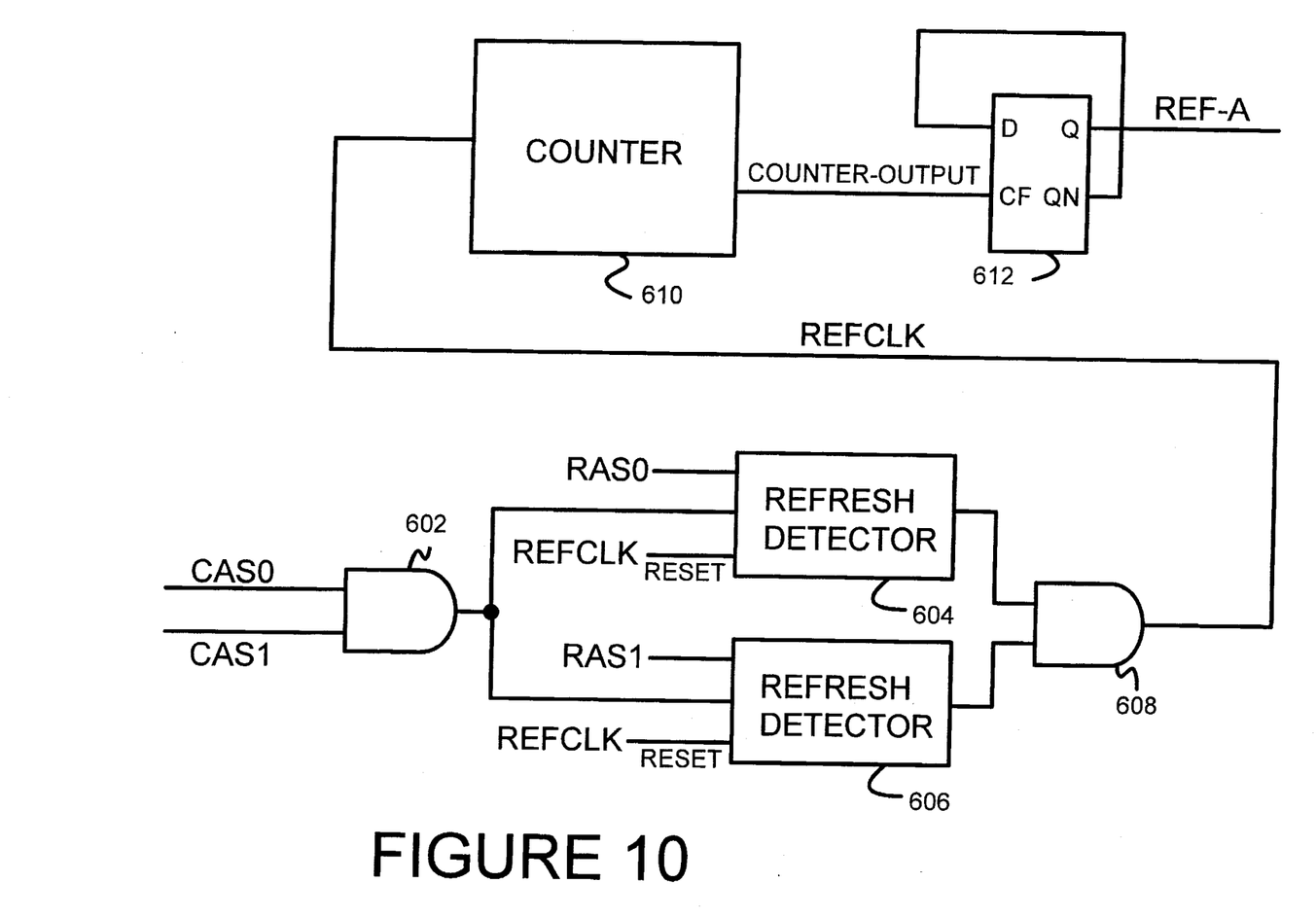
FIG. 10 is a diagram of a refresh counter utilized in the RAS encoder circuit of FIG. 7.

The refresh counter 306 is utilized to maintain the appropriate addressing scheme during RAS only refresh of the DRAM. Referring now to FIG. 10 a block diagram of a preferred embodiment of the refresh counter 306 is shown. The refresh counter 306 include AND gate 602 which receives a CAS0 signal at one input and CAS1 signal at its other input. The output of AND gate 602 is coupled to inputs of refresh detectors 604 and 606, respectively. Refresh detector 604 receives the RAS0 signal at one input. Refresh detector 606 receives the RAS1 signal at one input. The output from refresh detector 604 is coupled to one input of the AND gate 608. The output of AND gate (REFCLK) is coupled to an input to the counter 610, and the reset inputs of refresh detectors 604 and 606, respectively. The output of counter 610 is coupled to flip-flop 612. The output of flip-flop 612 is the REF_A signal. The REF_A signal is provided to the one input of NAND gate 506 (FIG. 9).

This refresh counter is particularly important during a RAS only refresh cycle to ensure that the addressing scheme is maintained. As is well known, in the RAS only refresh the CAS signal is not active. Typically the RAS0 and RAS1 signals are active low and close to the same time to allow for optimizing system speed during operations.

Figure 11:
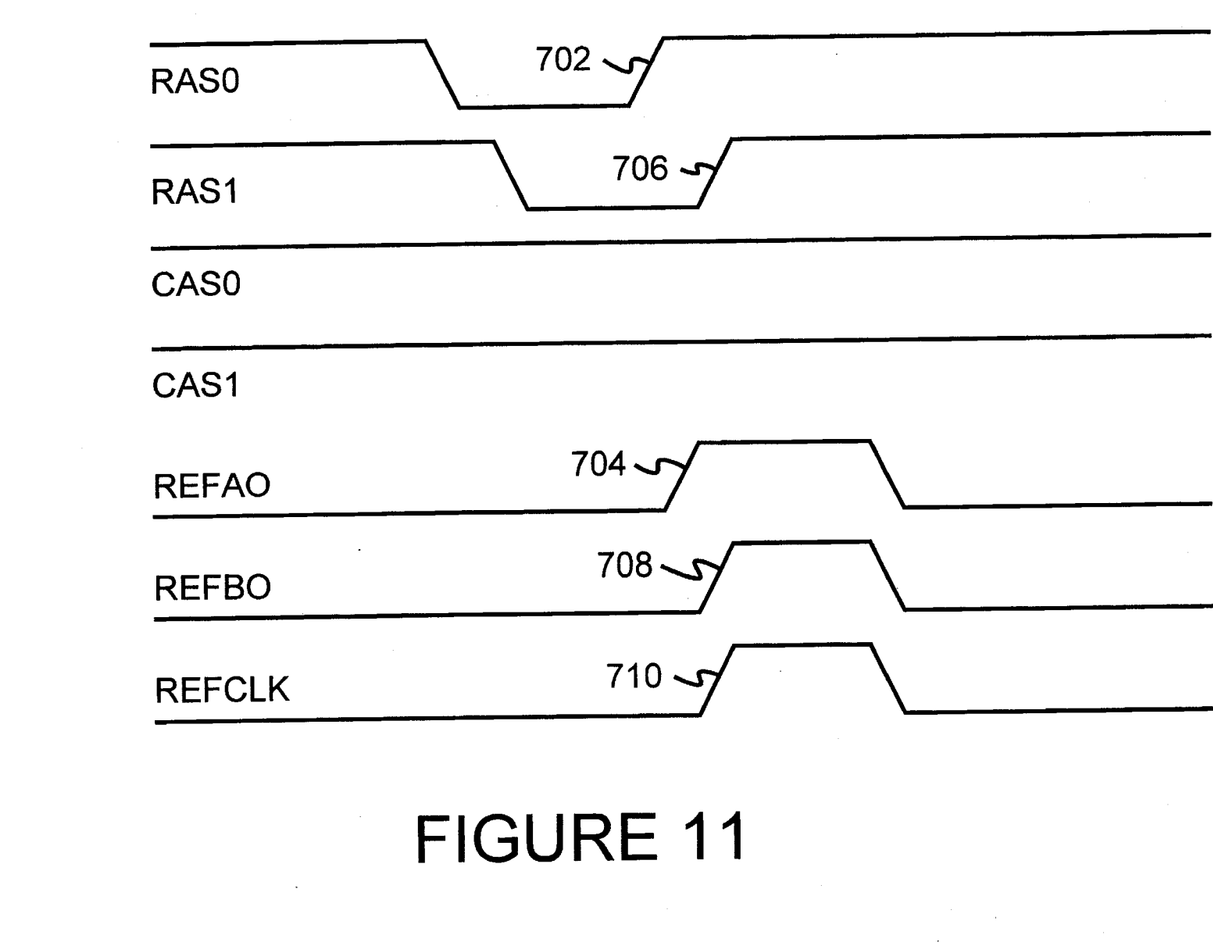
FIG. 11 is a timing diagram of the operation of the refresh counter of FIG. 10.

To more clearly describe the operation of refresh counter 306 refer now to FIG. 11 which are waveforms illustrating the operation of the circuit in conjunction with FIG. 10. Accordingly, when RAS0 goes high at 702, the output from refresh detector 604 (REFAO) also goes high at 704. Thereafter when RAS1 goes high at 706, the output from refresh detector 606 (REFBO) at 708 similarly goes high. Accordingly, the output of AND gate 608 goes high (REFCLK) at 710, thereby triggering the counter 610 to an increasing number. When the counter 610 reaches a predetermined number, then the counter output will trigger the flip-flop 612 REF_A to change state. The REFCLK signal also resets the refresh detectors 604 and 606 for the next refresh cycle.

Accordingly, a circuit is provided in accordance with the present invention that allows for the substitution of a memory module with one type of addressing scheme with a second memory module which has a different type of addressing scheme. Through the use of a row address strobe (RAS) generator and address generator which receives multiple RAS signals, a new RAS signal is generated that is in accordance with the one type of addressing scheme and an address signal is provided which indicates which portion of the memory is to be accessed. A system is thereby provided that allows for different types of DRAMs to be utilized in a single computer.

Although the present invention has been described in the context of a particular memory and particular addressing scheme, one of ordinary skill in the art will readily recognize a wide variety and types of memories could be utilized in conjunction with a number of addressing schemes and their use would be within the spirit and scope of the present invention.

Although the present invention has been described in accordance with the embodiments shown in the figures, one of ordinary skill in the art recognizes there could be variations to the embodiments and those variations would be within the spirit and scope of the present invention. Accordingly, many modifications may be made by one of ordinary skill in the art without departing from the spirit and scope of the present invention, the scope of which is defined by the appended claims.

We claim:

1. A circuit for providing an encoded row address strobe (RAS) in accordance with a first predetermined addressing scheme to a memory module which has a second predetermined addressing scheme within a computer, the circuit comprising:

an RAS generator means for receiving a first plurality of row address strobe (RAS) signals and generating a second RAS signal to the memory module; and an address generator means for receiving the first plurality of RAS signals, and for generating a plurality of address signals based upon the first plurality of RAS signals and for providing the plurality of address signals to indicate which portion of the memory module is to be accessed; so as to allow the memory module to operate in accordance with the first predetermined addressing scheme.

2. The circuit of claim 1 further comprises a counter means coupled to the address generator means, the first plurality of RAS signals and a column address signal to count the number of refreshes of the memory module.

3. The circuit of claim 2 in which the first predetermined addressing scheme comprises a row address strobe of 10 lines and a column address strobe of 10 lines.

4. The circuit of claim 1 in which the second predetermined addressing scheme comprises a row address strobe of eleven (11) lines and column address strobe of ten (10) lines.

5. The circuit of claim 1 in which the RAS generator means further comprises means for delaying the second RAS signals for a predetermined time period.

6. The circuit of claim 5 in which the RAS generator means further comprises:

a first logic gate for receiving the first plurality of RAS signals;

a delay means coupled to an output of the first logic gate; and a second logic gate coupled to the delay means for providing the second RAS signal.

7. The circuit of claim 6 in which the first logic gate comprises a NAND gate.

8. The circuit of claim 7 in which the second logic gate comprises an exclusive OR gate.

* * * * *